United States Patent [19]

Urmenyi

[11] 3,723,885

[45] Mar. 27, 1973

[54] CAPACITANCE PROXIMITY SWITCH

[76] Inventor: William Robert Urmenyi, 21 Church Road, Kingston on Thames, England

[22] Filed: May 3, 1971

[21] Appl. No.: 141,064

[30] Foreign Application Priority Data

June 17, 1970 Great Britain .................29271/70

[52] U.S. Cl. .......................328/5, 307/308, 317/146, 317/DIG. 2, 324/61 R

[51] Int. Cl. ...............................................H03k 1/18

[58] Field of Search..307/278, 308; 317/146, DIG. 2, 317/148.5; 328/5; 324/61 R; 340/258 C

[56] References Cited

UNITED STATES PATENTS

| | | | |
|---|---|---|---|
| 3,111,608 | 11/1963 | Boenning et al. | 317/DIG. 2 |
| 3,462,692 | 8/1969 | Bartlett | 328/5 |
| 3,508,120 | 4/1970 | Atkins | 317/148.5 |
| 3,200,306 | 8/1965 | Atkins et al. | 328/5 X |
| 3,366,847 | 1/1968 | Burns et al. | 307/308 X |
| 3,435,298 | 3/1969 | Atkins et al. | 307/308 X |

*Primary Examiner*—Stanley T. Krawczewicz

[57] ABSTRACT

The invention refers to a capacitance proximity switch which is more reliable than known devices. This is achieved by using a circuit which makes it possible to use digital circuits instead of linear amplifiers. The device comprises a square wave oscillator, a pulse stretcher fed by the oscillator using the capacitance between two electrically conducting bodies as at least part of the timing capacitance, means for detecting the change of mark-space ratio due to change of capacitance between the said two bodies and the means to operate a switch when the mark-space ratio differs from a predetermined value. The change of capacitance may be caused by changing the distance between the said two bodies or by approaching one or both of the bodies by a third body which latter may be a conductor or an insulator.

5 Claims, 2 Drawing Figures

CAPACITANCE PROXIMITY SWITCH

Conventional capacitance safe alarms consist of an oscillator, an a.c. bridge containing in one arm the capacitance of an insulated metal plate which is either the safe itself or is placed near to the safe, a differential amplifier to amplify the out of balance voltage of the a.c. bridge, and a rectifier and amplifier adapted to operate a relay. As long as no conductor is brought near to the insulated metal plate, the capacitance between that plate and earth remains constant and the output from the a.c. bridge doe not change. If a conductor is placed in the vicinity of the insulated metal plate, the output from the a.c. bridge changes, which causes the relay to operate.

The object of the present invention is to provide a capacitance proximity switch, which could be used as a safe alarm and which is more reliable than known devices. This is achieved by using a circuit which makes it possible to use digital logic integrated circuits instead of linear amplifiers. Of course the circuit of the present invention could be built up from discrete components and would still show an advantage of reliability.

The invention refers to a capacitance proximity switch comprising a square wave oscillator, a pulse stretcher fed by the oscillator using the capacitance between two electrically conducting bodies as at least part of the timing capacitance, means for detecting the change of mark-space ratio, due to change of capacitance between the said two bodies and means to operate a switch when the mark-space ratio differs from a predetermined value. One of the said two bodies may be the earth. The change of capacitance may be caused by changing the distance between the said two bodies or by approaching one or both of the bodies by a third body which latter may be a conductor or an insulator.

An essential feature of the invention is that the use of a bridge circuit which would necessitate the use of linear amplifiers is avoided.

The invention will now be more fully described by way of examples with reference to the accompanying drawing.

In the drawing

Figure 1:
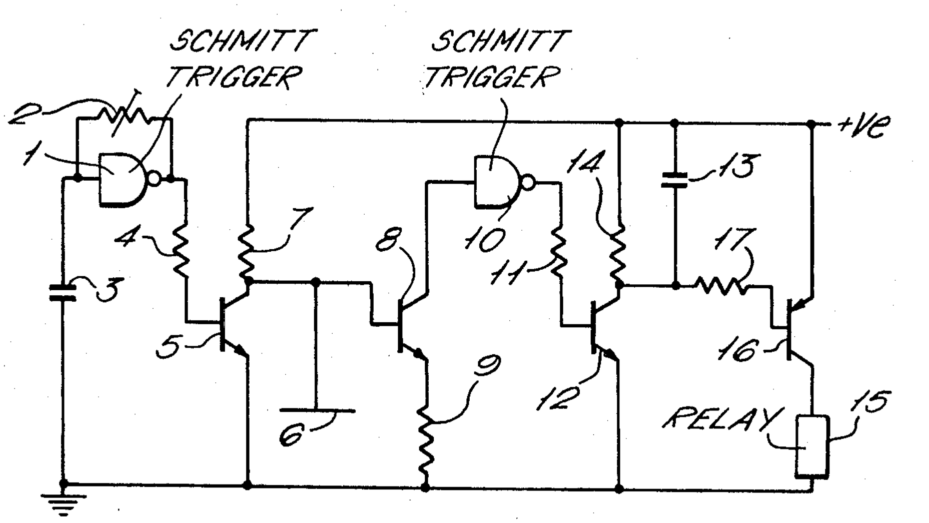
FIG. 1 is a circuit diagram of an example of the invention.

In FIG. 1, 1 is an inverting Schmitt trigger used as a square wave oscillator, 2 is a feed back rheostat, 3 is a timing capacitor, 4 is a buffer resistor, 5 is a transistor, 6 is an insulated metal plate, 7 is a resistor, 8 is a transistor used as a high impedance amplifier, 9 is a resistor, 10 is an inverting Schmitt trigger, the combination 5,6,7,8,9 and 10 being a pulse-stretcher, 11 is a buffer resistor, 12 is a transistor, 13 is a capacitor, 14 is a resistor, 15 is a relay, 16 is a transistor and 17 is a resistor.

In operation, the oscillator comprising 1, 2 and 3 produces square waves which turn transistor 5 on and off via 4 each cycle. When 5 is on, the insulated plate 6 is brought to earth potential, when 5 is off, the potential of 6 rises with the time constant given by the value of resistor 7 and the capacitance of plate 6. When this potential rises enough to turn on the high input impedance amplifier comprising 8 and 9, the output of Schmitt trigger 10 goes to 1 state causing transistor 12 to turn on via buffer resistor 11. The collector of transistor 12 is held at nearly zero volts by capacitor 13 and resistor 14 between cycles. This holds the relay 15 on via transistor 16 and resistor 17. The rheostat 2 is adjusted so that as long as there is no unwanted conductor near to capacitance plate 6 there is still a period of time during each cycle when the output of Schmitt trigger 10 is in the 1 state. If a body comes near to capacitance plate 6, the capacitance of that plate and therefore the time constant of 6 and 7 increases so that its potential does not have time to rise sufficiently to turn on transistor 8 before transistor 5 is turned on again on the following half cycle. This causes transistor 12 to be permanently off. When capacitance 13 has discharged through 14, 16 and 17, transistor 16 is turned off and relay 15 is de-energized. In security systems it is normal practice for the relay to be normally energized and to give an alarm when de-energized.

Figure 2:
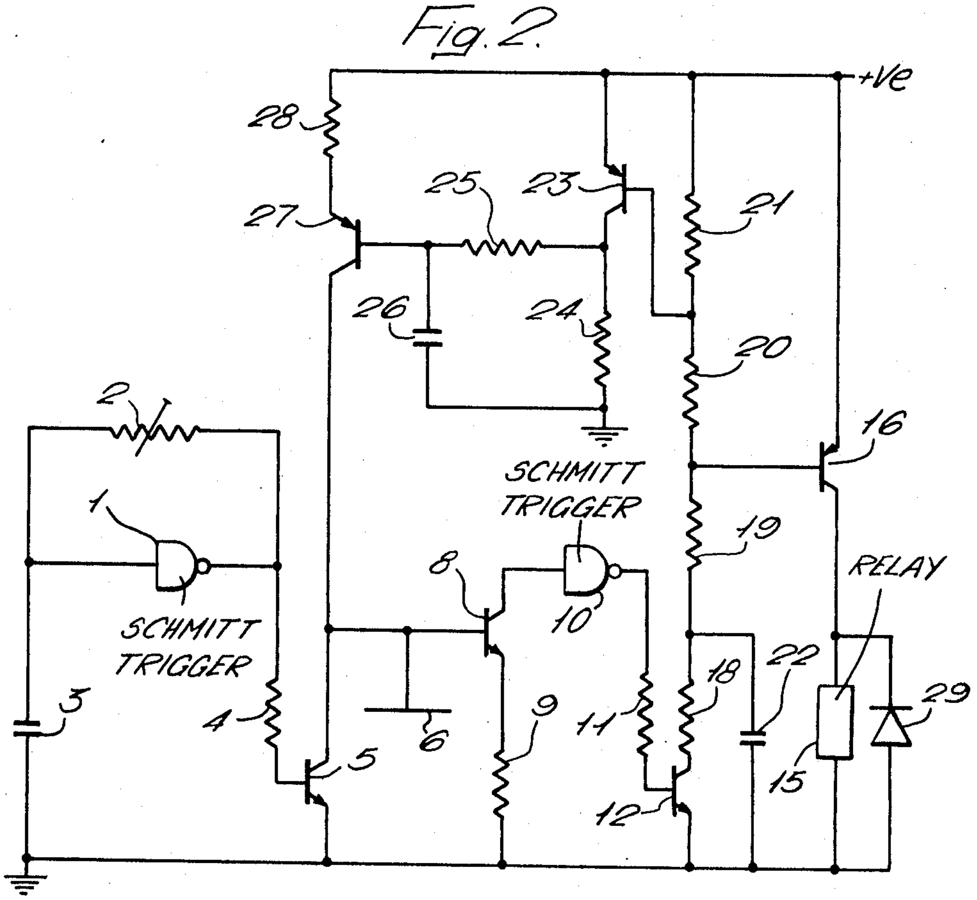
FIG. 2 is a circuit diagram of another example of the invention.

The example illustrated in FIG. 2 is in principle similar to that of FIG. 1 except that the addition of a very low frequency negative feedback path makes its operation more reliable in that gradual changes in oscillator frequency, gradual changes in capacitance of capacitor 6, and gradual changes in leakage resistance of capacitor 6, have a greatly reduced effect.

In FIG. 2 the numerals 1 to 6, 8 to 12, and 15 and 16 denote identical parts with identical functions to those in FIG. 1. Parts 18 to 28 constitute the said negative feedback path. Resistors 18 to 21 constitute a potential divider. Capacitor 22 and resistor 18 integrate the output of transistor 12. The direct voltage across capacitor 22 becomes a function of the mark-space ratio. Part of the potential difference between the potential on capacitor 22 and the positive supply appears at the base of transistor 16 which is normally on. A smaller portion of the same potential difference appears on the base of transistor 23, the output of which appears across resistor 24 and is fed via a time-constant circuit consisting of resistor 25 and capacitor 26 to the base of transistor 27 which acts as a constant current generator in conjunction with resistor 28 charging capacitor 6.

When the capacitance of part 6 is increased at a rate faster than that determined by the time constant of parts 25 and 26, the on to off ratio of transistor 8 decreases. This causes the on to off ratio of transistor 12 to decrease and thus the potential across capacitor 22 to increase, transistors 16 and 23 to turn off and relay 15 to be de-energized. Diode 29 is provided to suppress induced voltages in relay 15 protecting transistor 16. Capacitor 26 discharges via resistors 24 and 25. This increases the current through transistor 27 charging capacitor 6, thus partially counteracting the decreasing effect on the on to off ratio of transistor 8 caused by the increase of capacitance of 6.

If now we stop increasing the capacitance 6 any further, then the circuit settles down to the new condition and relay 15 becomes energized again.

The essential difference in the function of the two circuits is that the de-energizing of relay 15 in FIG. 1 depends on the increase of capacitance 6 above a predetermined value and the relay will remain de-energized whilst this increased value of the capacitance persists, whilst in the circuit of FIG. 2 relay 15 remains de-energized during the time when capacitance 6 is increasing and after that until the potential of capacitor 26 settles down to its steady state value, after which relay 15 becomes energized again.

It will be appreciated that there are many practical applications of the invention. It could be used for the protection of safes as a burglar alarm. In this case the safe itself, if insulated from ground, could form part of capacitance 6; or if not insulated, a separate plate could be mounted near the safe, insulated from it and used as part of capacitance 6. The invention could be used to protect windows which are provided with an insulated grill, when the latter could be utilized as part of capacitance 6. It could be used for counting passing objects which may be conducting or insulating, for detecting splices in paper and for many other purposes.

It will be understood that the FIGS. 1 and 2 represent examples of the invention and not its limitations.

What I claim is

1. A capacitance proximity switch comprising a square wave oscillator, a pulse stretcher, means to connect the oscillator to the pulse stretcher, two electrically conducting bodies having an electric capacitance between them, means to connect said capacitance to form at least part of a timing capacitance which determines the mark-space ratio, means for detecting the change of mark-space ratio due to change of capacitance between the said two bodies and means to operate a switch when the mark-space ratio differs from a predetermined value.

2. A capacitance proximity switch as claimed in claim 1 comprising also means to provide negative feed-back from the said means for detecting the change of mark-space ratio, the said negative feed-back, comprising a time-delay circuit, counteracting the change in the mark-space ratio.

3. A capacitance proximity switch as claimed in claim 1 comprising also means to provide negative feed-back from the said means for detecting the change of mark-space ratio to the said pulse stretcher.

4. A capacitance proximity switch as claimed in claim 1 comprising also means to provide negative feed-back from the said means for detecting the change of mark-space ratio, the said negative feed-back, comprising a time-delay circuit and an amplifier, counteracting the change in the mark-space ratio.

5. A capacitance proximity switch as claimed in claim 1 comprising also means to provide negative feed-back from the said means for detecting the change of mark-space ratio, the said negative feed-back comprising a time-delay circuit, an amplifier and a constant current generator, said constant current generator charging the timing capacitor.

* * * * *